(12) United States Patent
Park (10) Patent No.: US 8,255,776 B2
(45) Date of Patent: Aug. 28, 2012

(54) DIGITAL BROADCAST TRANSMISSION AND RECEPTION APPARATUSES AND METHODS THEREOF

(75) Inventor: Chan-sub Park, Incheon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1156 days.

(21) Appl. No.: 12/111,375

(22) Filed: Apr. 29, 2008

(65) Prior Publication Data

US 2008/0288851 A1 Nov. 20, 2008

Related U.S. Application Data

(60) Provisional application No. 60/938,055, filed on May 15, 2007.

(30) Foreign Application Priority Data

Jul. 24, 2007 (KR) ........................ 10-2007-0074051

(51) Int. Cl.
*H03M 13/00* (2006.01)
*G06F 11/00* (2006.01)

(52) U.S. Cl. ....................................... 714/784; 714/798

(58) Field of Classification Search .................. 714/784, 714/702, 789, 798, 707, 776, 752
See application file for complete search history.

(56) References Cited

U.S. PATENT DOCUMENTS

| | | | | |
|---|---|---|---|---|
| 5,363,408 A | * | 11/1994 | Paik et al. | 375/261 |
| 6,816,560 B1 | * | 11/2004 | Spalink | 375/368 |
| 7,016,446 B1 | * | 3/2006 | Spalink | 375/368 |
| 2001/0034867 A1 | | 10/2001 | Jaffe et al. | |
| 2002/0191712 A1 | | 12/2002 | Gaddam et al. | |
| 2007/0033475 A1 | | 2/2007 | Park et al. | |
| 2008/0267307 A1 | | 10/2008 | Chang et al. | |

FOREIGN PATENT DOCUMENTS

| | | |
|---|---|---|
| KR | 2005-111535 | 11/2005 |
| KR | 2005-122023 | 12/2005 |

OTHER PUBLICATIONS

International Search Report issued in International Application No. PCT/KR2008/002696 on Sep. 24, 2008.
U.S. Appl. No. 11/692,509, filed Mar. 28, 2007, Hae-joo Jeong et al., Samsung Electronics Co., Ltd.

* cited by examiner

*Primary Examiner* — Phung M Chung
(74) *Attorney, Agent, or Firm* — Sughrue Mion, PLLC

(57) ABSTRACT

A digital broadcast transmission apparatus includes a Reed-Solomon (RS) encoder to perform RS encoding of data to obtain RS-encoded data formatted in data packets each including a predetermined number of bytes; a sync byte inserter to insert sync bytes indicating a start point of one of the data packets in a predetermined location of the RS-encoded data; an interleaver to interleave the RS-encoded data after the sync bytes have been inserted in the RS-encoded data to obtain interleaved data; and a data stuffer to sequentially insert complete packets of the interleaved data each including the predetermined number of bytes in a field, and insert an initial portion of a final packet of the interleaved data beginning in the field in residual bytes of the field that are less than the predetermined number of bytes.

6 Claims, 5 Drawing Sheets

DIGITAL BROADCAST TRANSMISSION AND RECEPTION APPARATUSES AND METHODS THEREOF

CROSS-REFERENCE TO RELATED APPLICATIONS

This application claims the benefit of U.S. Provisional Application No. 60/938,055 filed on May 15, 2007, and Korean Patent Application No. 2007-74051 filed on Jul. 24, 2007, in the Korean Intellectual Property Office, the disclosures of which are incorporated herein by reference in their entirety.

BACKGROUND OF THE INVENTION

1. Field of the Invention

Aspects of the invention relate to digital broadcast transmission and reception apparatuses and methods thereof, and more particularly, to digital broadcast transmission and reception apparatuses to enhance transmission efficiency using residual bytes, and methods thereof.

2. Description of the Related Art

As electronics and communication technologies have progressed, various standards have been developed for use in digital broadcasting, such as the Advanced Television Systems Committee Vestigial Sideband (ATSC VSB) standard in the United States, and the Digital Video Broadcasting-Terrestrial (DVB-T) standard in Europe.

The ATSC VSB standard is used in the National Television System Committee (NTSC) frequency band, and has advantages such as the ease of implementation of a transmitter and a receiver, and in the economic aspect. The ATSC VSB standard uses a single-carrier amplitude modulation Vestigial Sideband (VSB) method, and can transmit high-quality video, audio, and ancilliary data in a single 6-MHz frequency band. Ancilliary data includes control data, conditional access control data, and data associates with program video and audio services, such as closed captioning, and can also refer to independent program services.

Figure 1:
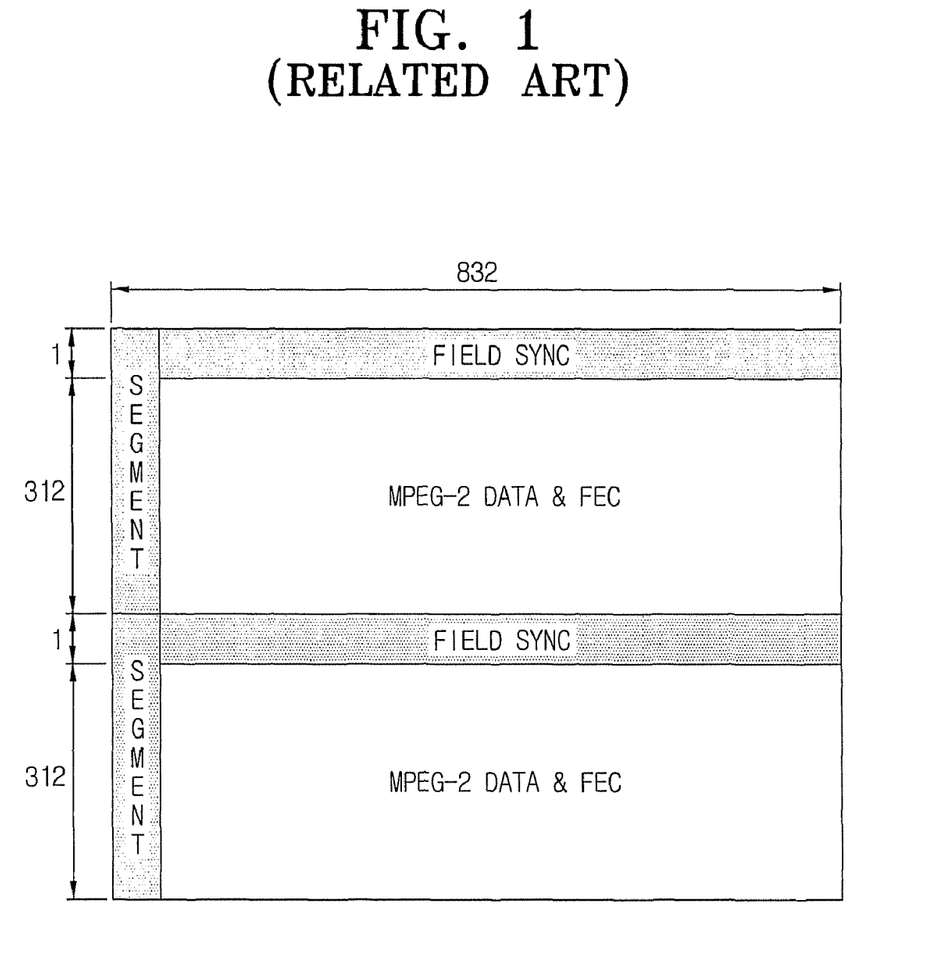
FIG. 1 shows the structure of a data frame of an ATSC VSB transmission method according to the related art.
Figure 2:
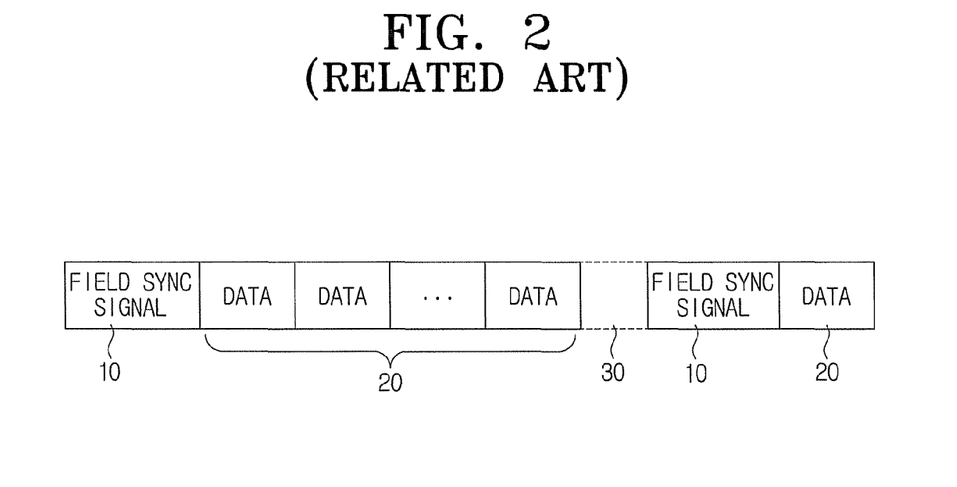
FIG. 2 shows a field of the data frame of FIG. 1 including residual bytes.

FIG. 1 shows the structure of a data frame of the ATSC VSB transmission method according to the related art, and FIG. 2 shows a field of the data frame of FIG. 1 containing residual bytes. As shown in FIG. 1, a single data frame used in the ATSC VSB transmission method consists of two fields. Each field includes a single field sync signal segment, and 312 data segments. A single segment in such a data frame corresponds to a single MPEG-2 packet, and the segment includes a segment sync signal of 4 symbols (1 byte) and 828 data symbols (207 bytes).

The field sync signal and the segment sync signal are used for synchronization and equalization in a broadcast receiver. The field sync signal and the segment sync signal are predetermined data that are known to both a digital broadcast transmitter and a digital broadcast receiver, and are used as reference signals for performing equalization in the receiver.

When each of the 312 data segments of a field of the data frame shown in FIG. 1 is generated, a Reed-Solomon (RS) encoder in the digital broadcast transmitter performs forward error correction (FEC) encoding of 187 data bytes to obtain 20 parity bytes that are appended to the 187 data bytes to obtain the 207 bytes (828 symbols) of the data segment.

Referring to FIG. 2, in the ATSC VSB system according to the related art, the digital broadcast transmitter and the digital broadcast receiver operate on the presumption that a start point of a first data 20 appearing after a field sync signal 10 is a start point of new data 20. However, depending on the size of the data 20, there may be residual bytes 30 at the end of a field that are too small to contain new data. Accordingly, the residual bytes 30 shown in FIG. 2 cannot be used to transmit new data because they would contain only an initial portion of the new data, such that the first data 20 after the field sync signal 10 of the next field would contain a final portion of the new data packet. Thus, a start point of the first data 20 after the field sync signal 10 of the next field would not be the start point of new data as would be expected by the digital broadcast receiver. Accordingly, in the ATSC VSB system according to the related art, the residual bytes 30 are transmitted in an empty state by the digital broadcast transmitter, thereby reducing a transmission efficiency.

Since the residual bytes 30 are transmitted in an empty state by the digital broadcast transmitter of the ATSC VSB system according to the related art, a predetermined number of the data 20 in a field are decoded in the digital broadcast receiver of the ATSC VSB system according to the related art, and the residual bytes 30 are discarded, thereby reducing the transmission efficiency.

SUMMARY OF THE INVENTION

Aspects of the invention relate to digital broadcast transmission and reception apparatuses that enhance a transmission efficiency by inserting data in residual bytes of a field that otherwise would not used and would be discarded, and methods thereof.

According to an aspect of the invention, a digital broadcast transmission apparatus includes a Reed-Solomon (RS) encoder to perform RS encoding of data to obtain RS-encoded data formatted in data packets each including a predetermined number of bytes; a sync byte inserter indicating a start point of one of the data packets in a predetermined location of the RS-encoded data; an interleaver to interleave the RS-encoded data after the sync bytes have been inserted in the RS-encoded data to obtain interleaved data; and a data stuffer to sequentially insert complete packets of the interleaved data in a field, and insert an initial portion of a final packet of the interleaved data beginning in the field in residual bytes of the field that are less than the predetermined number of bytes.

According to an aspect of the invention, the digital broadcast transmission apparatus further includes an interleaving controller to control the interleaver not to interleave the sync bytes inserted by the sync byte inserter.

According to an aspect of the invention, the data stuffer inserts a final portion of the final packet of the interleaved data beginning in the field in a next field; and the predetermined location is a start point of a first complete packet of the interleaved data to be inserted in the next field.

According to an aspect of the invention, the sync bytes include a predetermined number of sync bytes.

According to an aspect of the invention, a digital broadcast transmission method includes performing Reed-Solomon (RS) encoding of data to obtain RS-encoded data formatted in data packets each including a predetermined number of bytes; inserting sync bytes indicating a start point of one of the data packets in a predetermined location of the RS-encoded data; interleaving the RS-encoded data after the sync bytes have been inserted in the RS-encoded data to obtain interleaved data; and sequentially inserting complete packets of the interleaved data each including the predetermined number of bytes in a field; and inserting an initial portion of a final packet of the interleaved data beginning in the field in residual bytes of the field that are less than the predetermined number of bytes.

According to an aspect of the invention, the interleaving includes not interleaving the inserted sync bytes.

According to an aspect of the invention, the digital transmission further includes inserting a final portion of the final packet of the interleaved data beginning in the field in a next field; and the predetermined location is a la start point of a first complete packet of the interleaved data to be inserted in the next field.

According to an aspect of the invention, a digital broadcast reception apparatus includes a sync byte detector to detect sync bytes from a received transport stream including packets of interleaved data, the sync bytes indicating a start point of a first complete packet of the interleaved data in a field; a deinterleaver to deinterleave the interleaved data of the transport stream to obtain deinterleaved data; and a Reed-Solomon (RS) decoder to perform RS decoding of the deinterleaved data based on the start point indicated by the detected sync bytes to obtain RS-decoded data.

According to an aspect of the invention, the deinterleaver does not deinterleave the detected sync bytes.

According to an aspect of the invention, a digital broadcast reception method includes detecting sync bytes from a received transport stream including packets of interleaved data, the sync bytes indicating a start point of a first complete packet of the interleaved data in a field; deinterleaving the interleaved data of the transport stream to obtain deinterleaved data; and performing Reed-Solomon (RS) decoding of the deinterleaved data based on the start point indicated by the detected sync bytes to obtain RS-decoded data.

According to an aspect of the invention, the deinterleaving includes not deinterleaving the detected sync bytes.

According to an aspect of the invention, a digital broadcast transmission apparatus includes a Reed-Solomon (RS) encoder to perform RS encoding of data to obtain RS-encoded data formatted in data packets each including a predetermined number of bytes; a sync byte inserter to insert sync bytes in the RS-encoded data indicating a start point of a first complete packet of interleaved data to be inserted in each of a plurality of fields; an interleaver to interleave the RS-encoded data after the sync bytes have been inserted in the RS-encoded data to obtain interleaved data; and a data stuffer to insert the sync bytes and a plurality of complete packets of the interleaved data each including the predetermined number of bytes in each of the fields, and insert only an initial portion of a final packet of the interleaved data including the predetermined number of bytes beginning in each of the fields in residual bytes less than the predetermined number of bytes remaining in each of the fields after the sync bytes and the plurality of complete packets of the interleaved data have been inserted in each of the fields.

According to an aspect of the invention, a digital broadcast transmission apparatus includes a Reed-Solomon (RS) encoder to perform RS encoding of data to obtain RS-encoded data formatted in data packets each including a predetermined number of bytes; a sync byte inserter to insert sync bytes in the RS-encoded data indicating a start point of a first complete packet of interleaved data including the predetermined number of bytes to be inserted in each of a plurality of fields each beginning with a field sync signal; an interleaver to interleave the RS-encoded data after the sync bytes have been inserted in the RS-encoded data; and a data stuffer to insert only a final portion of a final data packet of the interleaved data beginning in a preceding field in a current field following the field sync signal of the current field, the final data packet including the predetermined number of bytes and the final portion including a number of bytes less than the predetermined number of bytes, insert the sync bytes indicating the start point of the first complete packet of the interleaved data to be inserted in the current field in the current field following the final portion inserted in the current field, and insert the first complete packet of the interleaved data to be inserted in the current field in the current field following the sync bytes inserted in the current field.

Additional aspects and/or advantages of the invention will be set forth in part in the description that follows and, in part, will be obvious from the description, or may be learned by practice of the invention.

BRIEF DESCRIPTION OF THE DRAWINGS

The above and/or other aspects and advantages of the invention will become apparent and more readily appreciated from the following description of embodiments of the invention, taken in conjunction with the accompanying drawings of which.

DETAILED DESCRIPTION OF THE EMBODIMENTS

Reference will now be made in detail to embodiments of the invention, examples of which are shown in the accompanying drawings, wherein like reference numerals refer to like elements throughout. The embodiments of the invention are below in order to explain the invention by referring to the figures.

An improvement to the ATSC VSB system, known as the Advanced VSB system or AVSB system, is disclosed, for example, in U.S. patent application Ser. No. 11/692,509 filed on Mar. 28, 2007, which was published as U.S. Patent Application Publication No. 2007/0230460 on Oct. 4, 2007. The contents of U.S. patent application Ser. No. 11/692,509 are incorporated herein by reference in their entirety.

One aspect of the AVSB system is a turbo mode, in which a stream of turbo data is subjected to RS encoding to obtain RS-encoded turbo data packets each including 207 bytes, including 187 data bytes and 20 parity bytes. These RS-encoded turbo data packets are divided into turbo data fragments, which are inserted in adaptation fields of MPEG-2 transport packets. In one example of the turbo mode, an adaptation field having a capacity of 128 bytes is provided in every fourth data segment, so that 78 such adaptation fields are provided in the 312 data segments of one field. These 78 adaptation fields have a total capacity of 78*128=9984 bytes, which can hold 48 complete turbo data packets of 207 bytes, leaving a residual of 48 bytes in each field (48*207=9936+48=9984). However, it is understood that adaptation fields having other capacities can be used, such as capacities of 32 bytes, 64 bytes, 86 bytes, 96 bytes, and 384 bytes. Accordingly, the number of residual bytes in a field may be different according to the capacity of the adaptation fields that is used.

However, in order to provide more robust data reception under less than ideal conditions, such as in mobile applications in which a receiver may be moving, the RS-encoded turbo data packets may be expanded by inserting placeholder bits among the data bits of the bytes of the RS-encoded turbo data packets to reduce the transmission rate before the turbo data packets are divided into the turbo data fragments. The placeholder bits are then filled with other encoded data to increase the robustness of the transmitted turbo data stream before the turbo data packets are divided into the turbo data fragments. For example, three placeholder bits may be inserted after every data bit to obtain a ¼ transmission rate, and one placeholder bit may be inserted after every data bit to obtain a ½ transmission rate. This reduces the total number of complete turbo data packets that can be encapsulated in one field of 312 data segments. However, it is understood that other transmission rates can be used, such as transmission rates of ⅙, ⅓, ⅔, ⅛, and ⅜.

For example, in the example discussed above in which 78 data segments in one field each include an adaptation field with a capacity of 128 bytes into which the turbo data fragments are inserted, the ¼ transmission rate reduces the number of complete turbo data packets that can be encapsulated in one field from 48 to 12, and the ½ transmission rate reduces the number of complete turbo data packets that can be encapsulated in one field from 48 to 24. However, in either case, there is still a residual of 48 bytes in each field.

The problem of the residual bytes in the AVSB system may be described using FIG. 2 as a simplified view of a structure of a field of a data frame in the AVSB system according to the related art. In this simplified view, the field sync signals 10 in FIG. 2 correspond to the field sync signal at the beginning of each field, each of the data 20 in FIG. 2 corresponds to one adaptation field containing turbo data fragments, and reference numeral 30 in FIG. 2 indicates the residual bytes in the field discussed above. In the example described above using adaptation fields having a capacity of 128 bytes, each of the data 20 corresponds to one adaptation field containing 128 bytes of turbo data fragments, and the residual bytes are 48 bytes. The rest of the elements of the field are not shown to simplify the description of the invention.

Figure 3:
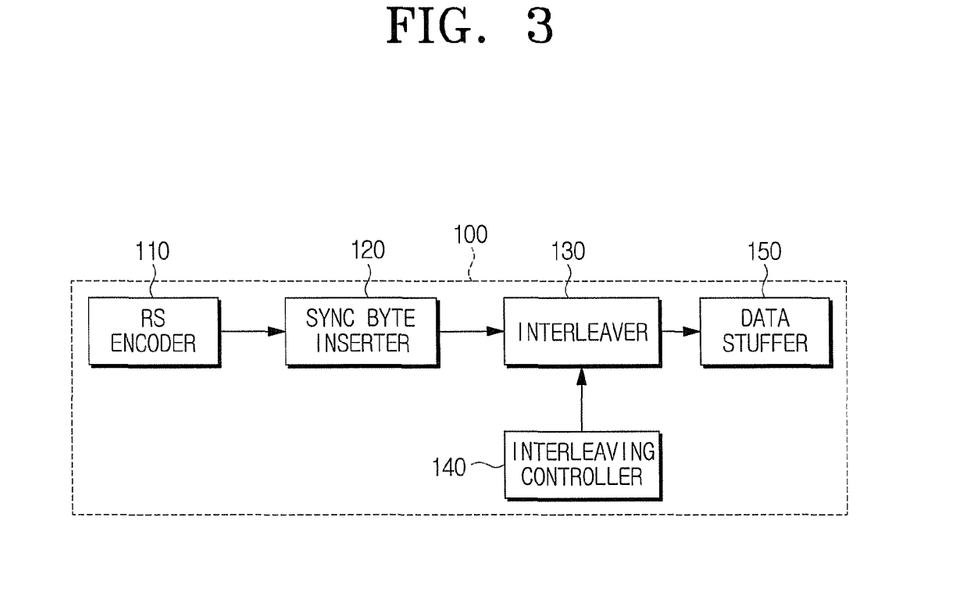
FIG. 3 is a block diagram of a digital broadcast transmission apparatus according to an aspect of the invention.

FIG. 3 is a block diagram of a digital broadcast transmission apparatus 100 according to an aspect of the invention. Referring to FIG. 3, the digital broadcast transmission apparatus 100 includes a Reed-Solomon (RS) encoder 110, a sync byte inserter 120, an interleaver 130, an interleaving controller 140, and a data stuffer 150. Such a digital broadcast transmission apparatus may be a digital broadcast transmission apparatus in a commercial television broadcasting station for transmitting video and/or audio data to a stationary receiver, a mobile receiver, a handheld receiver, any other device capable of receiving audio and/or video data, or any combination thereof.

The RS encoder 110 performs RS encoding of data to obtain RS-encoded data formatted in data packets each including a predetermined number of bytes. The RS encoding performed by the RS encoder 110 is a well-known type of forward error correction (FEC) coding that enables a receiver to detect and correct errors in received data. However, it is understood that other types of forward error correction can be used. Furthermore, while not required in all aspects of the invention, the data that is encoded by the RS encoder 110 may be video and/or audio data to be displayed and/or played on a display and/or player connected to a digital broadcast reception apparatus 200 that will be described below with respect to FIG. 4.

The sync byte inserter 120 inserts sync bytes indicating a start point of one of the data packets in a predetermined location of the RS-encoded data obtained by the RS encoder 110. The sync bytes may include a predetermined number of bytes. The size and the format of the sync bytes are predetermined, and are therefore known to both the digital broadcast transmission apparatus 100 and the digital broadcast reception apparatus 200 that will be described below with respect to FIG. 4. For example, the sync bytes may include 2 bytes. However, it is understood that the sync bytes may include more or less than 2 bytes.

As will be described in detail below, the data packets of the RS-encoded data are interleaved and inserted in fields. When residual bytes less than the predetermined number of bytes in each of the data packets of the RS-encoded data remain in a current field after a maximum possible number of complete packets of the interleaved data have been inserted into the current field, an initial portion of a final packet of the interleaved data beginning in the current field is inserted in the residual bytes of the current field, and a final portion of the final packet of the interleaved data beginning in the current field is inserted in the next field, and the sync byte inserter 120 inserts the sync bytes at a start point of a first complete packet of the interleaved data to be inserted in the next field. The sync bytes indicate to the digital broadcast reception apparatus 200 the start point of the first complete packet of interleaved data in each field so that the digital broadcast reception apparatus 200 can correctly decode the interleaved data in each field.

The interleaver 130 interleaves the RS-encoded data after the sync bytes have been inserted. The interleaving rearranges the RS-encoded data into units of a predetermined size so that bits damaged due to noise can be restored from the RS-encoded data. The placement of the interleaver 130 in the location shown in FIG. 3 is an enhancement of the AVSB system disclosed in U.S. patent application Ser. No. 11/692,509 referred to above. However, the actual operation of the interleaver 130 is similar to the operation of the interleavers of the AVSB system disclosed in U.S. patent application Ser. No. 11/692,509, and therefore will not be described here.

The interleaving controller 140 controls the interleaver 130 not to interleave the sync bytes inserted by the sync byte inserter 120 when the interleaver 130 is interleaving the RS-encoded data because the sync bytes indicate the start point of the first complete packet of interleaved data in the next field to the digital broadcast reception apparatus 200 so that the digital broadcast reception apparatus 200 can correctly decode the interleaved data in the next field. Accordingly, if the sync bytes are interleaved, the start point of the first complete packet of interleaved data in the next field cannot be determined by the digital broadcast reception apparatus 200.

The data stuffer 150 sequentially inserts complete packets of the interleaved data obtained from the interleaver 130 in a current field. Each of the complete data packets of the interleaved data includes the same predetermined number of bytes that are included in each of the data packets of the RS-encoded data obtained by the RS encoder 110. The data stuffer 150 also inserts an initial portion of a final packet of the interleaved data beginning in the current field in residual bytes of the current field that are less than the predetermined number of bytes in each of the complete packets of the interleaved data.

The residual bytes of the current field are the bytes remaining after deducting a maximum possible integer multiple of the predetermined number of bytes included in each of the data packets of the RS-encoded data obtained by the RS encoder 110 from a total capacity for the interleaved data in the current field. For example, the predetermined number of bytes included in each of the data packets of the RS-encoded data obtained by the RS encoder 110 may be 207 bytes, including 187 data bytes and 20 parity bytes obtained by the RS encoding operation performed by the RS encoder 110. However, it is understood that the data packets of the RS-encoded data may have other numbers of data bytes and/or parity bytes, such as 188 data bytes and 20 parity bytes. Accordingly, the number of residual bytes in a field may be different according to the number of bytes in each of the data packets of the RS-encoded data.

The digital broadcast transmission apparatus 100 of FIG. 3 can be used to insert any turbo data stream of the AVSB system into fields of a MPEG-2 transport stream to be transmitted. However, such turbo data stream need not be used in all aspects of the invention, and the transport stream is not limited only to an MPEG-2 transport stream or improvements thereon.

Since the data stuffer 150 inserts interleaved data even in the residual bytes of a field, an initial portion of a final packet of the interleaved data beginning in the current field may be inserted in the residual bytes of the current field, and a final portion of the final packet of the interleaved data that cannot be inserted in the current field may be inserted in the next field. In that case, the sync bytes are inserted at a start point of the first complete packet of the interleaved data in the next field using the sync byte inserter 120. In fact, the sync bytes are inserted at a start point of the first complete packet of the interleaved data in each field, regardless of whether the first complete packet is the first packet in the field, or a second or subsequent packet in the field. As a result, the digital broadcast reception apparatus 200 can determine the start point of the first complete packet of the interleaved data in every field so that the digital broadcast reception apparatus 200 can correctly decode the interleaved data in every field.

The description of the digital broadcast transmission apparatus 100 shown in FIG. 3 has been simplified to focus only on the elements required to insert interleaved data in the residual bytes of a field, and to insert sync bytes so that the digital broadcast reception apparatus 200 can recognize the first complete packet of the interleaved data in every field. Accordingly, the digital broadcast transmission apparatus 100 must include additional elements, such as an AVSB exciter (not shown) and other elements required to implement the AVSB system (not shown), in addition to the RS encoder 110, the sync byte inserter 120, the interleaver 130, the interleaving controller 140, and the data stuffer 150. However, these additional elements, including the AVSB exciter and the other elements required to implement the AVSB system, are known in the art, and therefore will not be described here.

The packets of interleaved data inserted in fields by the data stuffer 150 are processed by the AVSB exciter, and are transmitted to the digital broadcast reception apparatus 200 in a MPEG-2 transport stream format.

Figure 4:
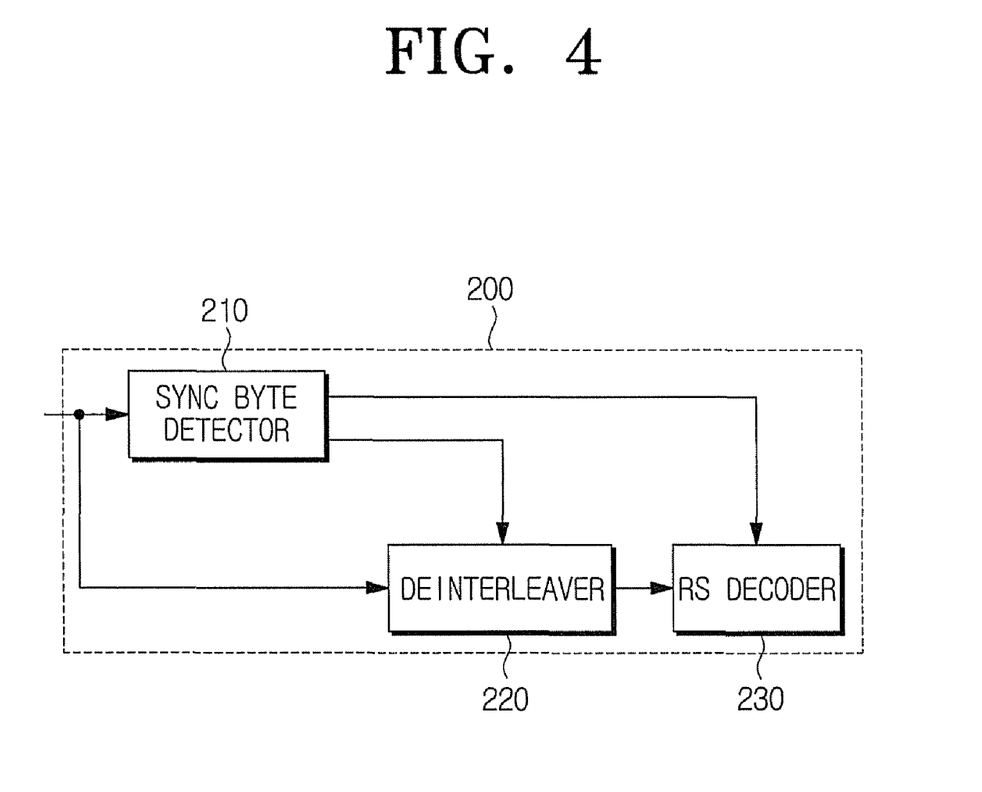
FIG. 4 is a block diagram of a digital broadcast reception apparatus according to an aspect of the invention.

FIG. 4 is a block diagram of a digital broadcast reception apparatus 200 according to an aspect of the invention. Referring to FIG. 4, the digital broadcast reception apparatus 200 includes a sync byte detector 210, a deinterleaver 220, and a Reed-Solomon (RS) decoder 230.

The sync byte detector 210 detects the sync bytes indicating a start point of the first complete packet of interleaved data in each field from the transport stream received from the digital broadcast transmission apparatus 100 that were inserted by the sync byte inserter 120 of the digital broadcast transmission apparatus 100, and which may include a predetermined number of bytes.

Since the size and the format of the sync bytes is predetermined, the sync byte detector 210 already knows the size and the format of the sync bytes, and therefore can detect the sync bytes.

The deinterleaver 220 deinterleaves the received transport stream. The deinterleaving is the reverse of the interleaving performed by the interleaver 130 of the digital broadcast transmission apparatus 100, and restores the interleaved data to the original RS-encoded data.

The deinterleaver 220 receives information regarding the location of the sync bytes in the received transport stream from the sync byte detector 210, and does not deinterleave the sync bytes. Since the interleaver 130 of the digital broadcast transmission apparatus 100 did not interleave the sync bytes, the deinterleaver 220 does not deinterleave the sync bytes.

The RS decoder 230 receives information regarding the location of the sync bytes in the received transport stream from the sync byte detector 210, and performs RS decoding of the original RS-encoded data obtained by deinterleaving the received transport stream based on the location of the sync bytes. The RS decoding is the reverse of the RS encoding performed by the RS encoder 110 of the digital broadcast transmission apparatus 100.

FIG. 4 shows only the elements of the digital broadcast reception apparatus 200 corresponding to the elements of the digital broadcast transmission apparatus 100 shown in FIG. 3 to simplify the description of the invention. However, the digital broadcast reception apparatus 200 must include additional elements, such as a demodulator (not shown), an equalizer (not shown), and other elements required to implement the AVSB system (not shown), in addition to the sync byte detector 210, the deinterleaver 220, and the RS decoder 230. However, these additional elements, including the demodulator, the equalizer, and the other elements required to implement the AVSB system, are known in the art, and therefore will not be described here.

Figure 5:
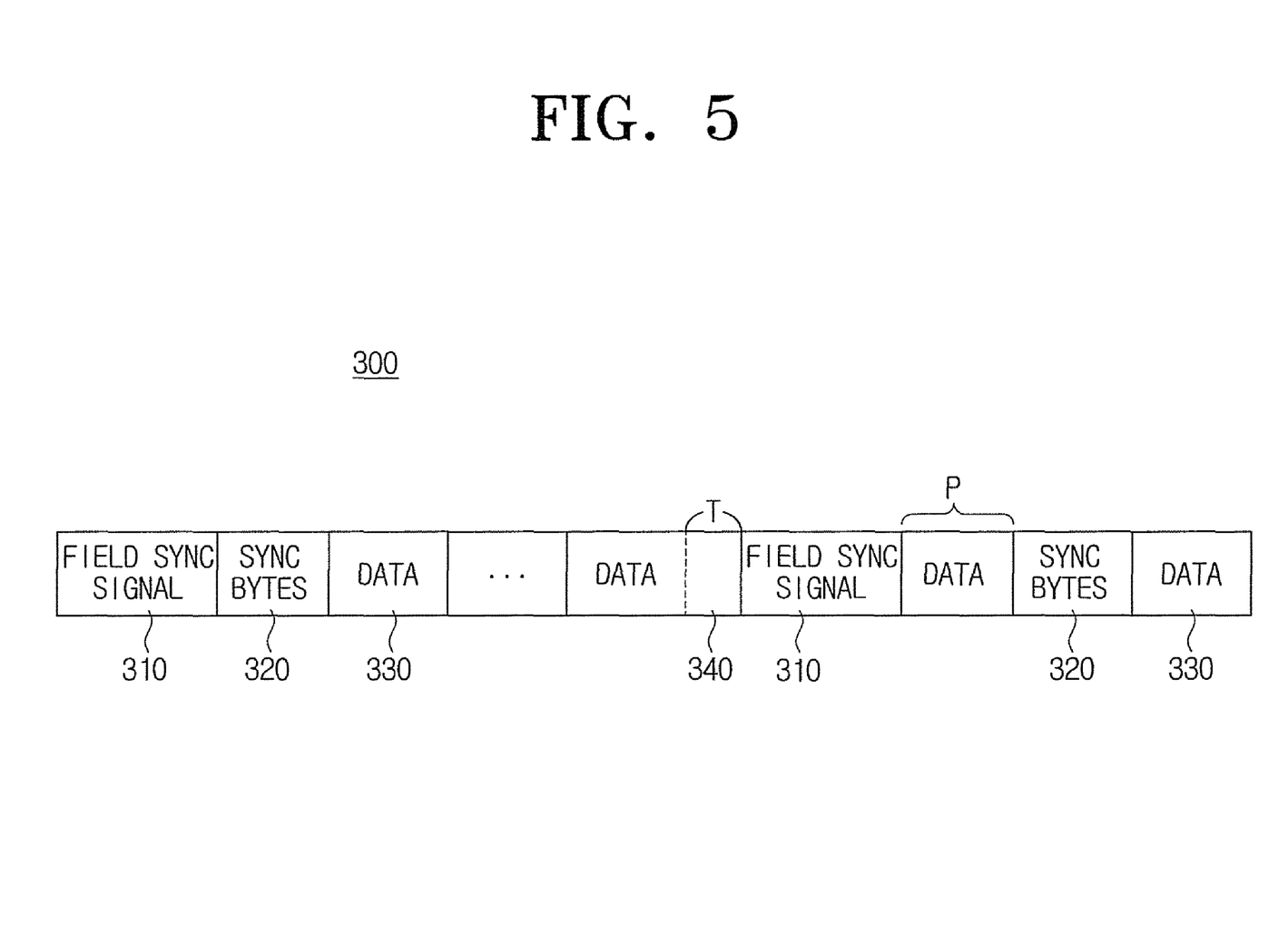
FIG. 5 shows the structure of a transport stream received by the digital broadcast reception apparatus of FIG. 4 according to an aspect of the invention.

FIG. 5 shows the structure of a transport stream 300 received by the digital broadcast reception apparatus 200. As discussed above, the digital broadcast transmission apparatus 100 transmits data in a MPEG-2 transport stream format. The digital broadcast reception apparatus 200 then receives the transport stream 300 from the digital broadcast transmission apparatus 100. An example of the transport stream 300 received by the digital broadcast reception apparatus 200 is shown in FIG. 5. It is understood that the transmission can be through wired and/or wireless systems. Also, while the transport stream 300 is described as being transmitted, it is understood that the transport stream 300 can also be recorded on a recording medium.

Referring to FIG. 5, the transport stream 300 includes field sync signals 310, sync bytes 320, and interleaved data 330. The first field sync signal 310 indicates a first field. The first sync bytes 320 following the first sync signal 310 indicate a start point of a first complete packet of interleaved data in the first field. Residual bytes 340 of the first field consisting of T bytes are shown at the end of the first field, and an initial portion (consisting of T bytes of interleaved data) of a final packet of interleaved data beginning in the first field has been inserted in the residual bytes 340.

The second field sync signal 310 indicates a second field. A final portion (consisting of P bytes of interleaved data) of the final packet of interleaved data beginning in the first field that was left after the insertion of the initial portion (consisting of P bytes of interleaved data) in the residual bytes 340 in the first field has been inserted in the second field after the second field sync signal 310. Thus, T+P equals the total number of bytes of interleaved data in one complete packet of interleaved data. The second sync bytes 320 following the P bytes indicate a start point of a first complete packet of interleaved data in the second field.

The structure of the received transport stream 300 shown in FIG. 5 is a conceptual arrangement in which each of the data 330 corresponds to an adaptation field containing one or more turbo data fragments. The actual received transport stream includes other elements that are not shown to simplify the description of the invention.

When the digital broadcast reception apparatus 200 receives the transport stream, the sync byte detector 210 detects the sync bytes 320 from the transport stream. Consequently, the RS decoder 230 can determine a start point of the first complete packet of interleaved data in each field.

Assuming that the predetermined size of the sync bytes 320 that is known to both the digital broadcast transmission apparatus 100 and the digital broadcast reception apparatus 200 is 2 bytes, and a turbo mode 128 bytes is used, then the number of the residual bytes in each field is 48 bytes in the AVSB system according to the related art. Accordingly, inserting interleaved data 330 in the residual bytes 340 of each field and inserting sync bytes 320 in each field to indicate a start point of the first complete packet of interleaved data 330 in the field according to an aspect of the invention provides a net gain of 46 bytes in the data rates because the 2 sync bytes reduce the 48 residual bytes to 46 residual bytes that are available for the insertion of interleaved data.

Figure 6:
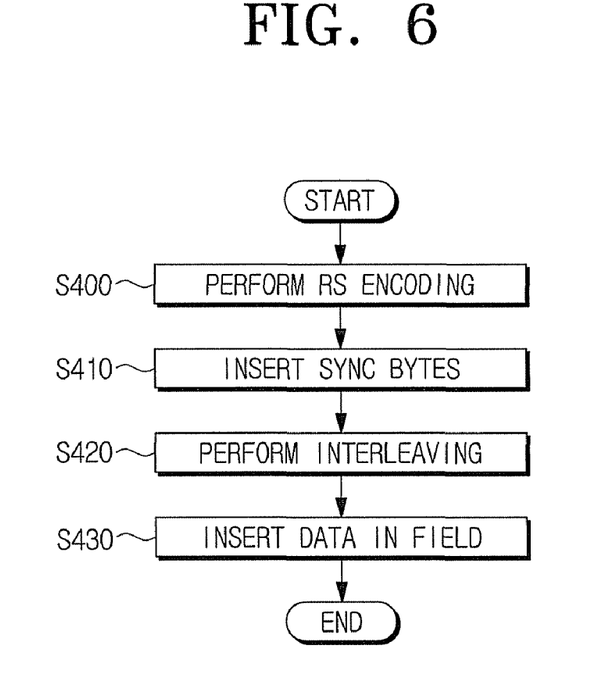
FIG. 6 is a flow chart of a digital broadcast transmission method according to an aspect of the invention.

FIG. 6 is a flow chart of a digital broadcast transmission method according to an aspect of the invention. The digital broadcast transmission method of the digital broadcast transmission apparatus 100 will be described with reference to FIGS. 3-6. In operation S400, the RS encoder 110 performs RS encoding of data to obtain RS-encoded data formatted in data packets each including a predetermined number of bytes. In operation S410, the sync byte inserter 120 inserts sync bytes 320 indicating a start point of one of the data packets in a predetermined location of the RS-encoded data. In operation S420, the interleaver 130 interleaves the RS-encoded data after the sync bytes 320 have been inserted. The interleaving controller 140 controls the interleaver 130 not to interleave the sync bytes 320. In operation S430, the data stuffer 150 sequentially inserts complete packets of the interleaved data 330 each including the predetermined number of bytes in a field, and inserts an initial portion (consisting of T bytes of interleaved data) of a final packet of the interleaved data beginning in the field in residual bytes 340 that are less than the predetermined number of bytes. The interleaved data inserted in the field by the data stuffer 150 are processed by the AVSB exciter, and transmitted to the digital broadcast reception apparatus 200.

Figure 7:
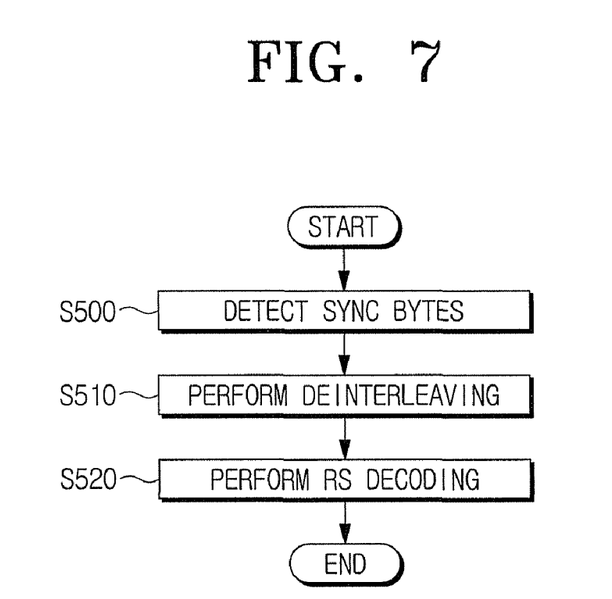
FIG. 7 is a flow chart of a digital broadcast reception method according to an aspect of the invention.

FIG. 7 is a flow chart of a digital broadcast reception method according to an aspect of the invention. The digital broadcast reception method of the digital broadcast reception apparatus 200 will be described with reference to FIGS. 3-7. In operation S500, the sync byte detector 210 detects sync bytes 320 from a received transport stream including packets of interleaved data 330. The sync bytes 320 have a predetermined size and format that are known to both the digital broadcast transmission apparatus 100 and the digital broadcast reception apparatus 200, and indicate a start point of a first complete packet of interleaved data 330 in each field of the received transport stream. In operation S510, the deinterleaver 220 receives information regarding the location of the sync bytes 320 in the received transport stream from the sync byte detector 210, and deinterleaves the transport stream except for the sync bytes 320 to obtain RS-encoded data. In operation S520, the RS decoder 230 receives information regarding the location of the sync bytes 320 in the received transport stream from the sync byte detector 210, and performs RS decoding of the RS-encoded data based on the location of the sync bytes 320.

As described above, digital broadcast transmission and reception apparatuses and methods thereof according to aspects of the invention enhance transmission efficiency by inserting data in residual bytes of a field that are not used to transmit data in an AVSB system according to the related art, and are therefore discarded during reception. It is understood that apparatuses and methods according to aspects of the invention may be implemented with software on a computer-readable medium.

While examples of aspects of the invention have been described relative to the AVSB system and specific data frames and field sizes, it is understood that aspects of the invention can be applied to other systems, and/or other standards, and/or other data frames, and/or other field sizes.

Although several embodiments of the invention have been shown and described, it would be appreciated by those skilled in the art that changes may be made in these embodiments without departing from the principles and spirit of the invention, the scope of which is defined in the claims and their equivalents.

What is claimed is:

1. A digital broadcast reception apparatus comprising:
    a sync byte detector to detect sync bytes from a received transport stream comprising packets of interleaved data, the sync bytes indicating a start point of a first complete packet of the interleaved data in a field;
    a deinterleaver to deinterleave the interleaved data of the transport stream to obtain deinterleaved data; and
    a Reed-Solomon (RS) decoder to perform RS decoding of the deinterleaved data based on the start point indicated by the detected sync bytes to obtain RS-decoded data,
    wherein when the field includes a portion of another packet before the first complete packet, the sync bytes indicate the start point of the first complete packet.

2. The digital broadcast reception apparatus of claim 1, wherein the sync bytes comprise a predetermined size of sync bytes.

3. The digital broadcast reception apparatus of claim 1, wherein the deinterleaver does not deinterleave the detected sync bytes.

4. A digital broadcast reception method comprising:
    detecting sync bytes from a received transport stream comprising packets of interleaved data, the sync bytes indicating a start point of a first complete packet of the interleaved data in a field;
    deinterleaving the interleaved data of the transport stream to obtain deinterleaved data; and
    performing Reed-Solomon (RS) decoding of the deinterleaved data based on the start point indicated by the detected sync bytes to obtain RS-decoded data,
    wherein when the field includes a portion of another packet before the first complete packet, the sync bytes indicate the start point of the first complete packet.

5. The digital broadcast reception method of claim 4, wherein the sync bytes comprise a predetermined size of sync bytes.

6. The digital broadcast reception method of claim 4, wherein the deinterleaving comprises not deinterleaving the detected sync bytes.

* * * * *